(12) United States Patent
Huang et al.

(10) Patent No.: US 9,991,190 B2
(45) Date of Patent: Jun. 5, 2018

(54) PACKAGING WITH INTERPOSER FRAME

(75) Inventors: Hui-Min Huang, Taoyuan (TW);
Yen-Chang Hu, Tai-Chung (TW);
Chih-Wei Lin, Xinfeng Township (TW); Ming-Da Cheng, Jhubei (TW);
Chung-Shi Liu, Hsinchu (TW);
Chen-Shien Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 709 days.

(21) Appl. No.: 13/475,674

(22) Filed: May 18, 2012

(65) Prior Publication Data

US 2013/0307140 A1 Nov. 21, 2013

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/495* | (2006.01) | |
| *H01L 23/00* | (2006.01) | |

(Continued)

(52) U.S. Cl.
CPC .......... *H01L 23/495* (2013.01); *H01L 21/568* (2013.01); *H01L 23/3107* (2013.01); *H01L 23/3121* (2013.01); *H01L 23/3128* (2013.01); *H01L 23/49811* (2013.01); *H01L 23/49827* (2013.01); *H01L 24/19* (2013.01); *H01L 25/105* (2013.01); *H01L 2224/12105* (2013.01); *H01L 2224/16225* (2013.01); *H01L 2224/48091* (2013.01); *H01L 2224/48247* (2013.01);

(Continued)

(58) Field of Classification Search
CPC . H01L 2224/48091; H01L 2924/00014; H01L 21/56; H01L 21/568; H01L 2224/16225; H01L 2224/48247; H01L 23/3107; H01L 23/3121; H01L 23/3128; H01L 23/48; H01L 23/495; H01L 24/19; H01L 25/105
See application file for complete search history.

(56) References Cited

U.S. PATENT DOCUMENTS 7,608,921 B2 * 10/2009 Pendse .................. H01L 21/563
257/686
2009/0302478 A1 * 12/2009 Pagaila et al. ................ 257/774
(Continued)

FOREIGN PATENT DOCUMENTS

| KR | 10-1003658 | 12/2010 |
| WO | WO 2010/021685 | 2/2010 |

OTHER PUBLICATIONS

Office Action dated Apr. 29, 2014 with English translation from corresponding application No. KR 10-2014-0011446.
(Continued)

*Primary Examiner* — Meiya Li
(74) *Attorney, Agent, or Firm* — Hauptman Ham, LLP

(57) ABSTRACT

The mechanisms of using an interposer frame to package a semiconductor die enables fan-out structures and reduces form factor for the packaged semiconductor die. The mechanisms involve using a molding compound to attach the semiconductor die to the interposer frame and forming a redistribution layer on one or both sides of the semiconductor die. The redistribution layer(s) in the package enables fan-out connections and formation of external connection structures. Conductive columns in the interposer frame assist in thermal management.

20 Claims, 12 Drawing Sheets

(51) Int. Cl.
*H01L 23/31* (2006.01)
*H01L 21/56* (2006.01)
*H01L 23/498* (2006.01)
*H01L 25/10* (2006.01)

(52) U.S. Cl.
CPC ............... *H01L 2224/48257* (2013.01); *H01L 2924/181* (2013.01)

(56) References Cited

U.S. PATENT DOCUMENTS

| | | | |
|---|---|---|---|
| 2010/0013081 A1* | 1/2010 | Toh ..................... | H01L 21/6835 257/692 |
| 2010/0117218 A1 | 5/2010 | Park et al. | |
| 2010/0237481 A1* | 9/2010 | Chi et al. ...................... | 257/685 |
| 2010/0244240 A1* | 9/2010 | Kapusta ............ | H01L 23/49827 257/737 |
| 2010/0289126 A1 | 11/2010 | Pagaila et al. | |
| 2013/0154091 A1* | 6/2013 | Wright ............. | H01L 23/49816 257/738 |

OTHER PUBLICATIONS

Office Action dated Jun. 18, 2014 with English translation from corresponding application No. KR 10-2012-0105982.

CJ, Bill, et al., "Advanced QFN Packaging for Low Cost and Solution", 2010 11th International Conference on Electronic Packaging Technology & High Density Packaging, pp. 45-49.

Lim, L. A., et al., "DreamPAK—Small Form Factor Package", EMPC 2009, pp. 1-6.

Tseng, Andy, et al, "Advanced QFN Surface Mount Application Notes Development", 2010 12th Electronics Packaging Technology Conference, pp. 737-742.

Servais, G. E., et al., "Wire Bonding—A Closer Look", The 17th International Symposium for Testing & Failure Analysis, Nov. 11-15, 1991, pp. 525-529.

Office Action dated Oct. 29, 2013 with English translation from corresponding application No. KR 10-2012-0105982.

* cited by examiner

PACKAGING WITH INTERPOSER FRAME

CROSS-REFERENCE TO RELATED APPLICATIONS

This application relates to the following co-pending and commonly assigned patent application Ser. No. 13/448,796, entitled "Package with Interposer Frame and Method of Making the Same" and filed on Apr. 17, 2012, and Ser. No. 13/433,210, entitled "Interposer Frame and Method of Manufacturing the Same" and filed on Mar. 28, 2012, both of which are incorporated by reference herein in their entireties.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reduction of minimum feature size, which allows more components to be integrated into a given area. These smaller electronic components also require smaller packages that utilize less area or height than prior packages, in some applications.

Thus, new packaging technologies, such as wafer level packaging (WLP) and package on package (PoP), have begun to be developed. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
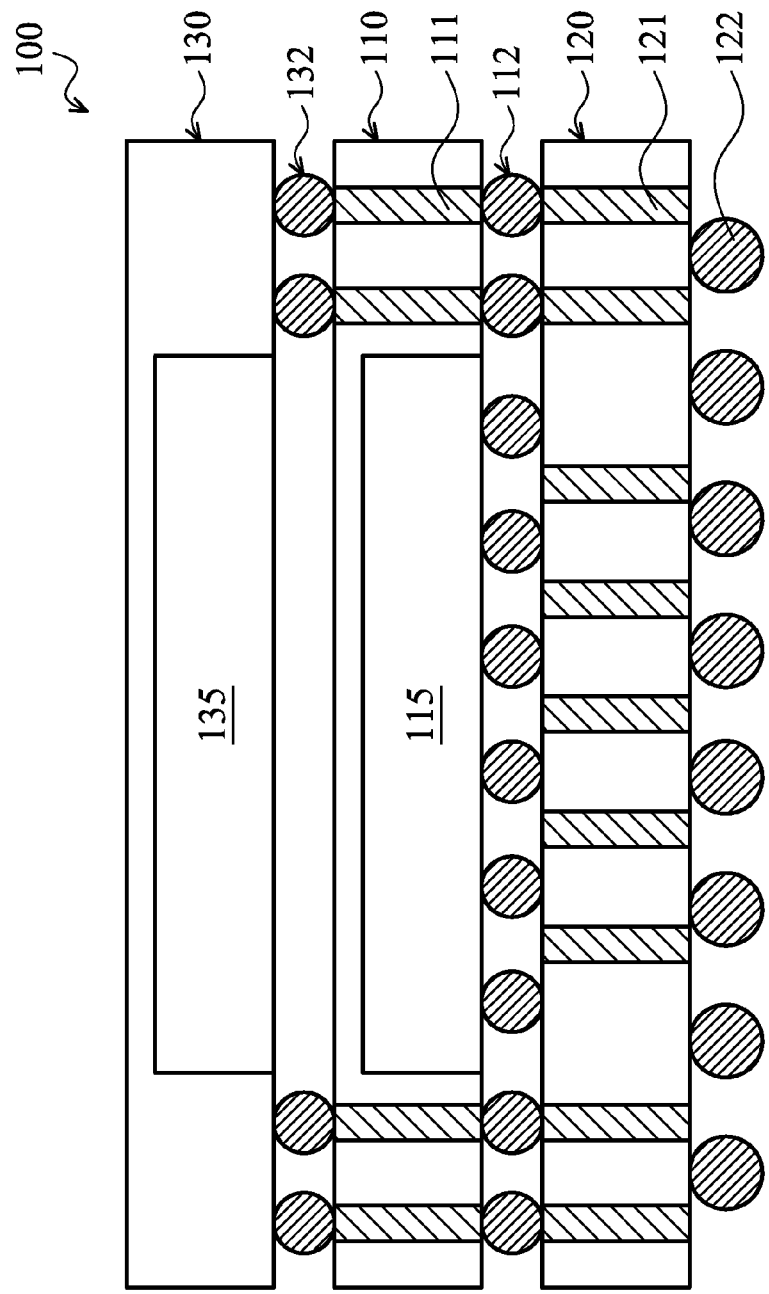
FIG. 1 shows a cross-sectional view of a chip package, in accordance with some embodiments.

FIG. 1 shows a cross-sectional view of a chip package 100, in accordance with some embodiments. Chip package 100 is a package on package (PoP) structure with packaged die 130, which has a die 135, over packaged die 110, which has a die 115. Chip package 100 also includes an interposer 120, which has through-substrate vias (TSVs) 121 and external connectors 122. Packaged die 110 and interposer 120 are connected to each other through bump structures 112. Package dies 110 and 130 are connected to each other through bump structures 132. Packaged die 110 also has through-package vias (TPVs) 111, whose aspect ratio could be higher than an aspect ratio of TSVs 121. As a result, it's challenging to form TPVs 111. In addition, a form factor of chip package 100 is not desirable due to its relatively large height by having the interposer 120 under the packaged dies 110 and 130. Further, the silicon-based interposer 120 has high mismatch of coefficient of thermal expansion (CTE) with printed circuit board (PCB) underneath the interposer 120. New packaging mechanisms with a better form factor than that using the interposer 120 while still preserving the benefit of thermal management by TSVs 121 in the interposer 120, will obviate the above-mentioned problems.

Recently, packaging frames become available for integrated circuit (IC) packaging. These packaging frames have conductive columns with thermal dissipation function similar to through-silicon vias and are fit around packaged dies. Because the packaging frames are fixed around packaged dies, the form factor is smaller than interposers. The examples of such packaging frames include, but are not limited to, DreamPak of ASM Pacific Technology Ltd. of Singapore, and Leadless-aQFN by ASE Inc. of Taipei, Taiwan.

Figure 2A:
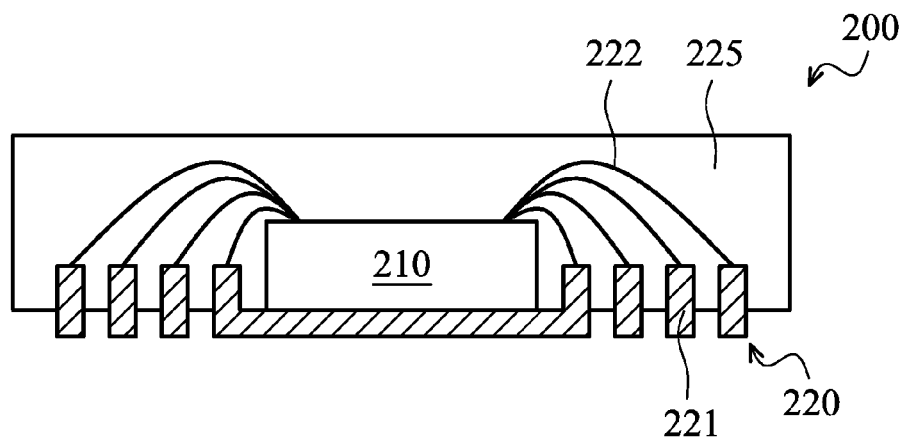
FIG. 2A shows a cross-sectional view of a die package, in accordance with some embodiments.
Figure 2B:
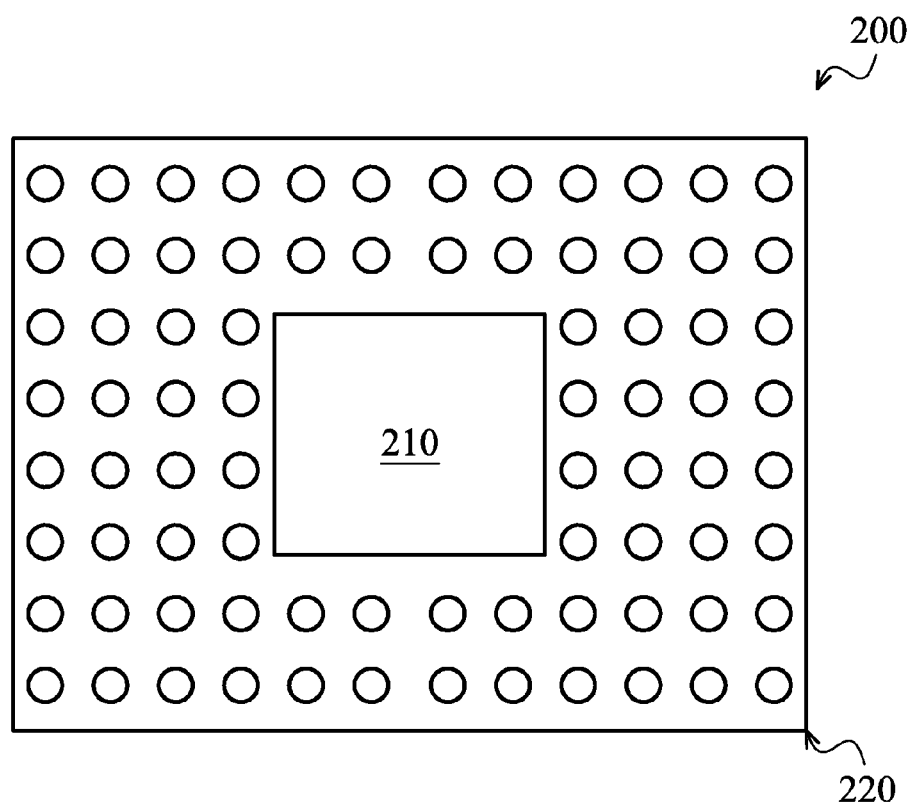
FIG. 2B shows a top view of the die package of FIG. 2A, in accordance with some embodiments.

FIG. 2A shows a cross-sectional view of die package 200 with a die 210 packaged with a packaging frame 220, in accordance with some embodiments. The packaging frame 220 has a number of conductive columns 221 connected to contacts (not shown) on die 210 via bonding wires 222. The conductive columns 221 provide electrical connections to external elements (not shown) and also enhance thermal dissipation. The packaged die 210 is enclosed at least partially in a molding compound 225. FIG. 2B illustrates a top view of die package 200 without showing the bond wires 222, in accordance with some embodiments. Packaging frames, such as packaging frame 220, can provide functions similar to interposers, such as thermal management and connections to package substrates. The manufacturing cost of packaging frame is much lower than interposers. In addition, the form factor of packaging with a packaging frame is smaller than packaging with an interposer, since the packaging frame 220 is placed next to the die 210, not below the die 210. Further, the manufacturing of packaging frames 220 solves the problem of difficulty in forming through-package vias, such as TPVs 111 described above. Additionally, the packaging frames 220 have lower mismatch of CTE with PCB underneath.

However, using bonding wires 222 to connect contacts on the (semiconductor) die 210 to conductive columns 221 enables packaging of dies on a two dimensional (2-D) level, not three dimensional (3-D) level. For advanced packaging, stacking package on package increases package density. Therefore, different mechanisms of forming packaged dies by using packaging frames need to be developed.

Figure 3A:
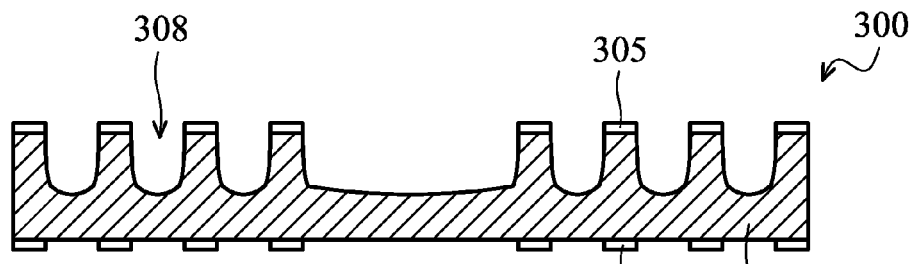
FIGS. 3A-3D shows cross-sectional views of a sequential process of forming an interposer frame, in accordance with some embodiments.

FIGS. 3A-3D shows cross-sectional views of a sequential process of forming an interposer frame 300, in accordance with some embodiments. The interposer frame 300 may be formed by patterning mask layers 305 and 306 and etching a conductive substrate 310, as shown in FIG. 3A in accordance with some embodiments. The conductive substrate 310 may be made of metal, which may include copper, copper alloy, or other types of metal or alloy. The mask layers 305 and 306 are made of a material resistant to the etching chemistry used to etch conductive substrate 310 to form openings 308. For example, mask layers 305 and 306 may be made of photoresist or a conductive material. The etching used to form openings 308 is a wet etch, in accordance with some embodiments.

Figure 3B:
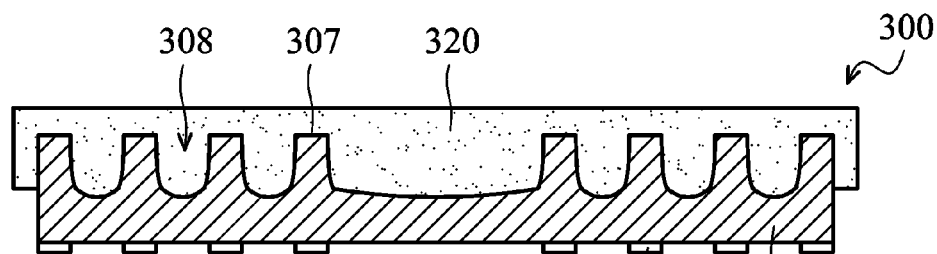
Figure 3C:
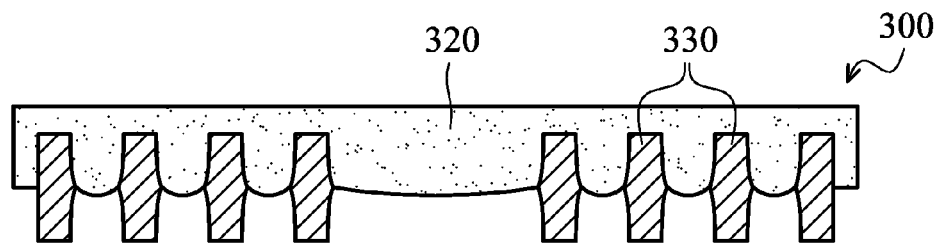
Figure 3D:
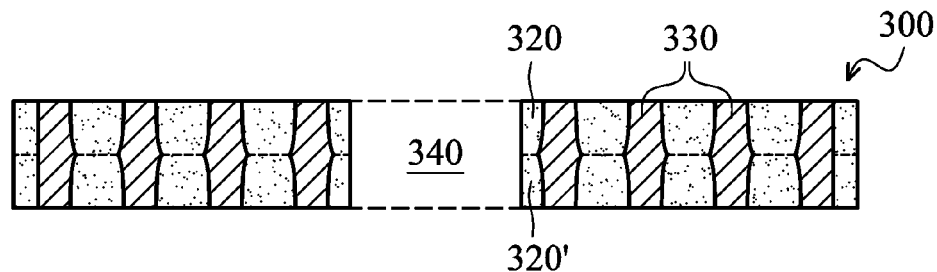

Afterwards, the mask layer 305 is removed and a molding compound 320 may be formed over the etched side of conductive substrate 310 to fill the etched openings 308 and to cover un-etched surfaces 307, as shown in FIG. 3B. After the molding compound 320 is formed to cover the etched side of conductive substrate 310, the other side of conductive substrate 310 patterned by mask layer 306 is etched. Portions of un-etched conductive substrate 310 form conductive columns 330, as shown in FIG. 3C in accordance with some embodiments. In some embodiments, a surface of one of the conductive columns 330 is curved. Conductive columns 330 may also be called through-molding vias (TMVs). Afterwards, molding compound 320' may be formed over the etched surface of the conductive substrate 310. In some embodiments, molding compound 320 and molding compound 320' are made of same material. Additional processing may be performed on conductive substrate 310 to expose the conductive columns 330, and to remove molding compound 320 and molding compound 320' in region 340, which is designed to place a semiconductor die (e.g., die 210 shown in FIG. 2A). FIG. 3D shows a finished interposer frame 300, in accordance with some embodiments. In some embodiments, molding compound 320' is not formed and the interposer frame 300 only includes molding compound 320.

The process sequence shown and described above in FIGS. 3A-3D shows how the interposer frame 300 is formed. The process is simple. As a result, the cost of forming the interposer frame 300 can be kept low.

Figure 4A:
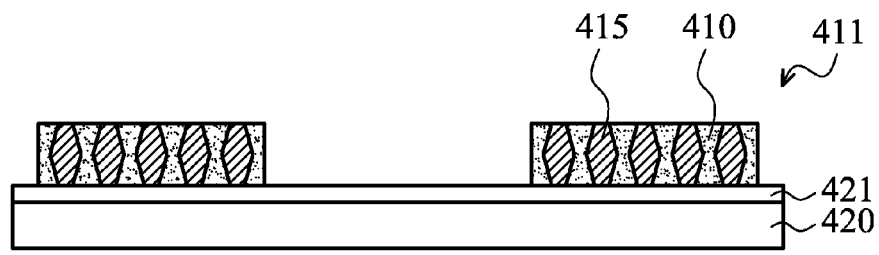
FIGS. 4A-4I show cross-sectional views of a sequential process of packaging a semiconductor die, in accordance with some embodiments.

FIGS. 4A-4I show cross-sectional views of a sequential process of packaging a semiconductor die, in accordance with some embodiments. FIG. 4A shows an interposer frame 411 being attached to a carrier 420. Carrier 420 includes an adhesive layer 421 to secure the interposer frame 411. In one or more embodiments, the carrier 420 supports many interposer frames 411 which includes a molding compound 410". The interposer frame 411 may be formed by a processing sequence described above in FIGS. 3A-3D. The interposer frame 411 includes through-molding vias (TMVs) 415, which are isolated from each other by the molding compound 410.

Figure 4B:
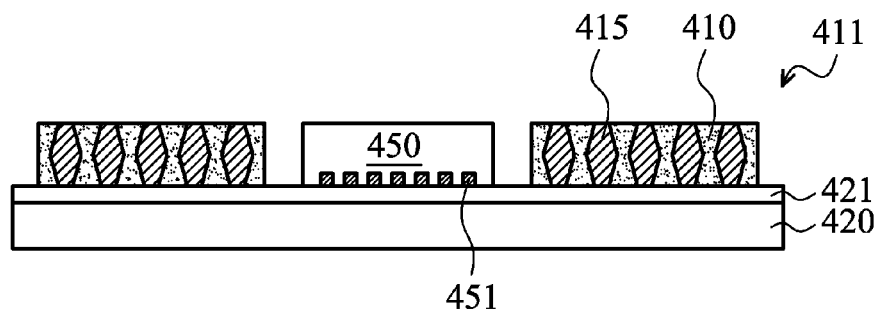

FIG. 4B shows a semiconductor die 450 being attached to the adhesive layer 421. The semiconductor die 450 includes devices (not shown) and interconnect 451. A front side of the semiconductor die 450 faces the adhesive layer 421. If carrier 420 supports more than one interposer frame 411, a semiconductor die 450 is attached to each of the interposer frames 411.

Figure 4C:
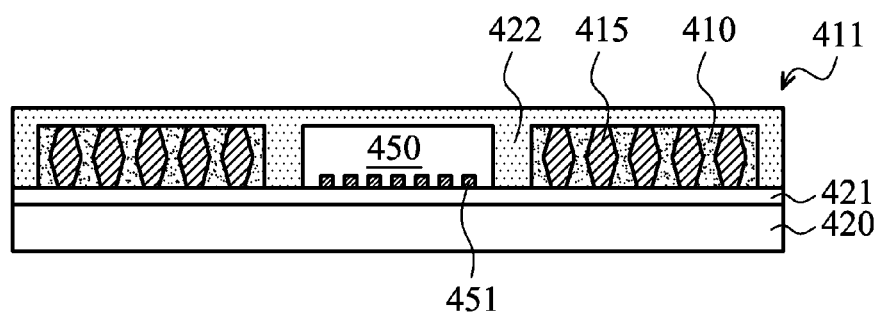

After the semiconductor die 450 is placed and set on the adhesive layer 421, a molding compound 422 is formed to fill a space between the semiconductor die 450 and the interposer frame 411 and also cover surfaces of the semiconductor die 450 and the interposer frame 411, as shown in FIG. 4C in accordance with some embodiments. The formation of the molding compound 422 may include dispensing a molding compound material over semiconductor die 450 and the interposer frame 411 and also curing the molding compound material.

Figure 4D:
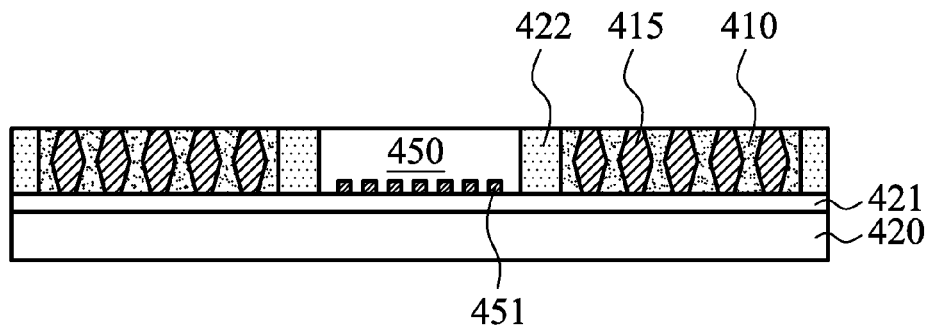
Figure 4E:
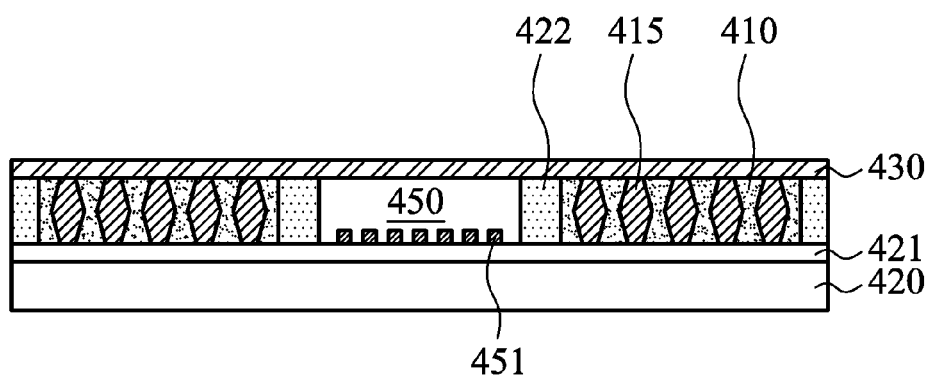

Afterwards, a portion of the molding compound 422 is removed to expose the through-molding vias 415, as shown in FIG. 4D in accordance with some embodiments. The removal process may be a grinding process, a polishing process, or a combination thereof. The through-molding vias 415 are exposed to make electrical contact with a redistribution layer (RDL) 430, as shown in FIG. 4E in accordance with some embodiments. The redistribution layer 430 is conductive and enables forming contacts for connecting with another packaged die. The redistribution layer 430 also enables connection between the other packaged die with TMVs 415. The formation of the redistribution layer 430 may involve forming one or more passivation layers to isolate conductive structures. The one or more passivation layers also relieve stress exerted upon the connections between packaged semiconductor die 450 and the other packaged die bonded to the packaged semiconductor die 450. Bumps (not shown) may be formed over the redistribution layer 430 to allow physical and electrical contacts with the other packaged die. Exemplary details of forming a redistribution layer 430 and bumps on the redistribution layer 430 are described in the following co-pending and commonly assigned patent application Ser. No. 13/228,244, entitled "Packaging Methods and Structures Using a Die Attach Film" and filed on Sep. 8, 2011, which is incorporated by reference herein in its entirety.

Figure 4F:
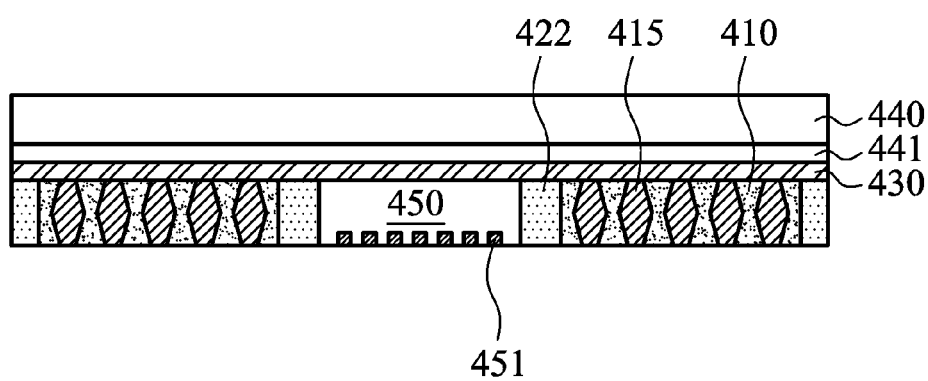
Figure 4G:
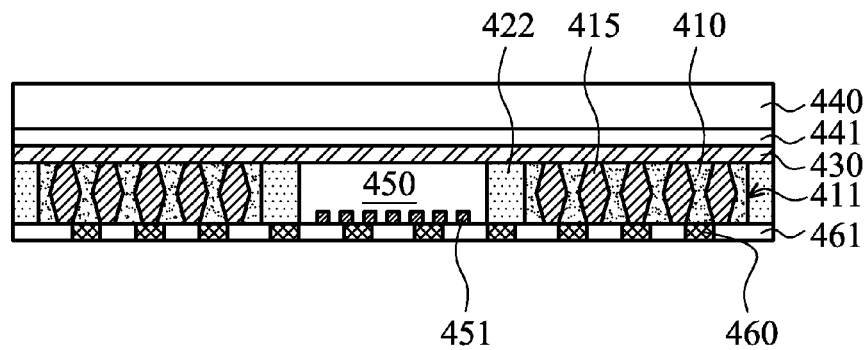

After the redistribution layer 430 with optional bumps is formed, the carrier 420, along with the adhesive layer 421, is removed from the partially packaged semiconductor die 450, as shown in FIG. 4F in accordance with some embodiments. A backside of the partially packaged semiconductor die 450 is placed on another carrier 440, which may include an adhesive layer 441. The front side of the partially packaged semiconductor die 450 then undergoes process operations to form a redistribution layer (RDL) 460 over the front-side of semiconductor die 450, as shown in FIG. 4G in accordance with some embodiments. In some embodiments, the redistribution layer 460 enables fan-out connection, which means connection beyond a boundary of the semiconductor die, of various devices on semiconductor die 450 with external contacts, such as bumps or balls. As mentioned above, forming the redistribution layer 460 may involve forming passivation layer(s), such as passivation layer 461, between the semiconductor die 450/interposer frame 411 and redistribution layer 460.

Figure 4H:
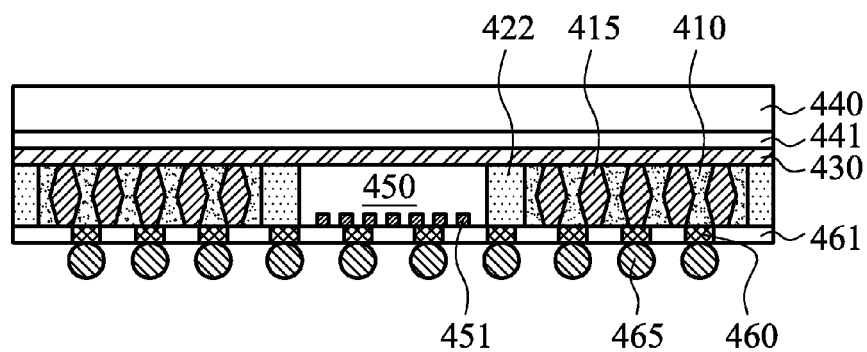
Figure 4I:
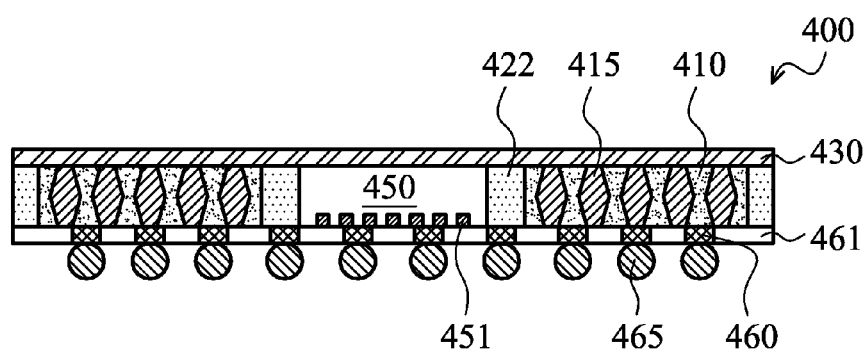

Afterwards, bumps 465 are formed on the redistribution layer 460, as shown in FIG. 4H in accordance with some embodiments. Bumps 465 may be used to bond the packaged die 450 to a substrate or another packaged die. After bump formation, the packaged dies on carrier 440 are singulated into individual packaged die 400 with both carrier 440 and adhesive layer 441 removed, as shown in FIG. 4I in accordance with some embodiments.

Figure 5:
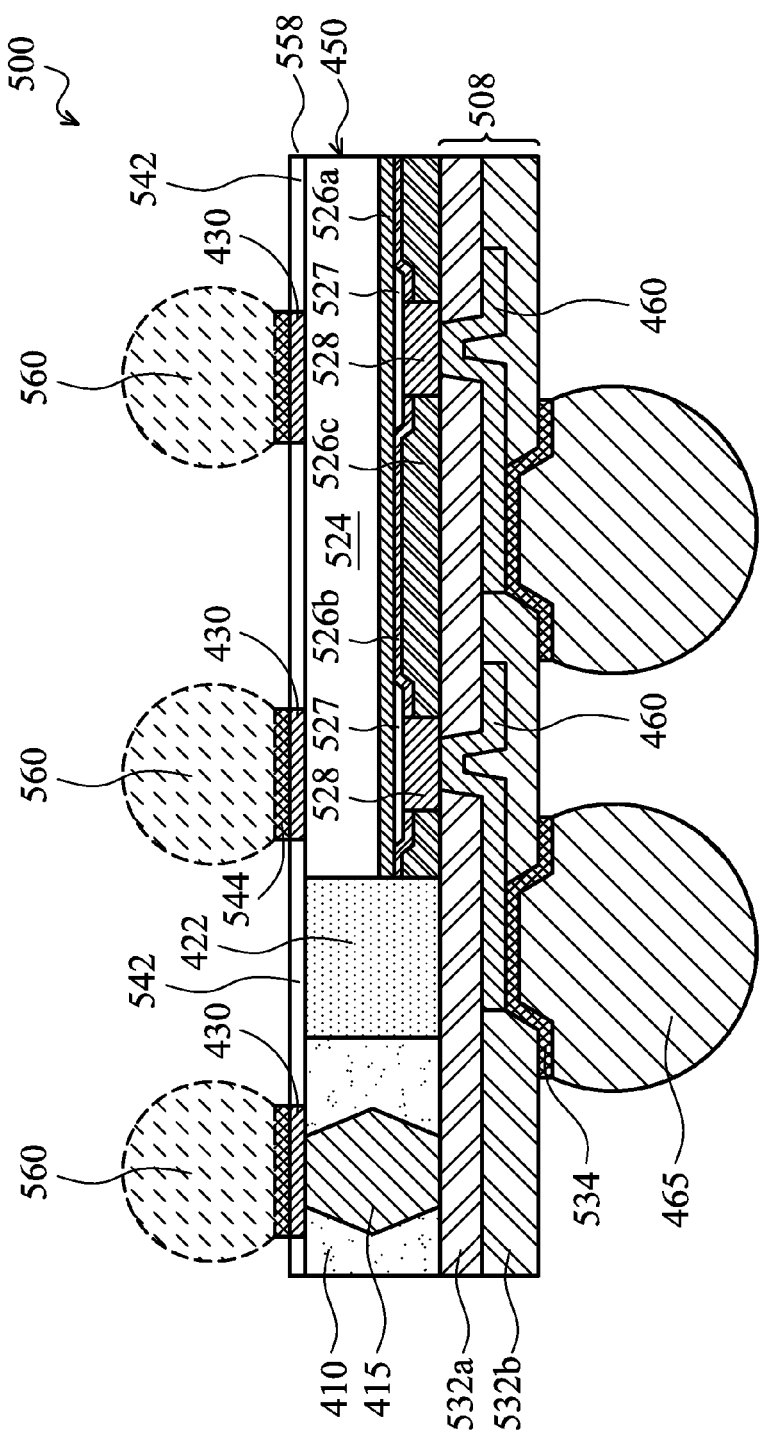
FIG. 5 shows a cross-sectional view of a portion of a packaged die, in accordance with some embodiments.

FIG. 5 shows a cross-sectional view of a portion 500 of packaged die 400, in accordance with some embodiments. FIG. 5 also shows a more detailed view of the semiconductor die 450 and the redistribution layers 430 and 460, in accordance with some embodiments. The view of the die 450 and redistribution layers 430 and 460 shown are exemplary; alternatively, the die 450 and redistribution layers 430, 460 may comprise other configurations, layouts and/or designs. In the embodiment shown, the die 450 includes a substrate 524 comprising silicon or other semiconductive materials. Insulating layers 526*a* and 526*b* are disposed on the substrate 524. Insulating layer 526*a* may include undoped silicon oxide, low-dielectric-constant (low-K) dielectric, and doped dielectric films. The dielectric constant of the low-K dielectric may be less than about 3.5, in some embodiments. In some other embodiments, the k value may be less than bout 2.5. Insulating layer 526*b* may be made of one or more dielectric layers, which may include oxide, nitride, polyimide, insulating polymers, and other applicable materials.

Contact pads 528 of the die 450 may be formed over conductive features of the substrate such as metal pads 527, plugs, vias, or conductive lines to make electrical contact with active features of the substrate 524, which are not shown. Contact pads 528 and metal pad 527 are part of interconnect 451 described above. The contact pads 528 may be formed in an insulating layer 526*c* that may comprise a polymer layer or other insulating materials.

A wiring layer 508 includes insulating layers 532*a* and 532*b* that comprise polymers or other insulating materials. The RDL 460 is formed within the insulating layers 532*a* and 532*b*, as shown, with portions of the RDL 460 making electrical contact with contact pads 528 on the die 450. An optional under bump metallization (UBM) structure (or layer) 534 may be formed on portions of the RDL 460 and insulating layer 532*b*, as shown. The UBM structure 534 facilitates the connection and formation of the bumps (or balls) 465, for example. Bumps 465 may be made of solder or may be copper pillar bumps. In other embodiments, bumps 465 may be other types of external contacts.

The other side of portion 500 of packaged die 450 includes wiring layer 558, which may include insulating layer 542 and RDL 430. Insulating layer 542 may be made of polymers or other insulating materials. Portions of RDL 430 and portions of RDL 460 contact one or more TMVs 415. An optional UBM layer 544 may be formed on portions of RDL 430, as shown in FIG. 5. The UBM structure 544 facilitates connection and formation of optional bumps (or balls) 560. Bumps 560 may be made of solder or may be copper pillar bumps. In other embodiments, bumps 560 may be other types of external contacts. In some embodiments, the wiring layer 558, the UBM layer 544, and the solder bumps 560 are not on the backside of the packaged die 450.

Figure 6:
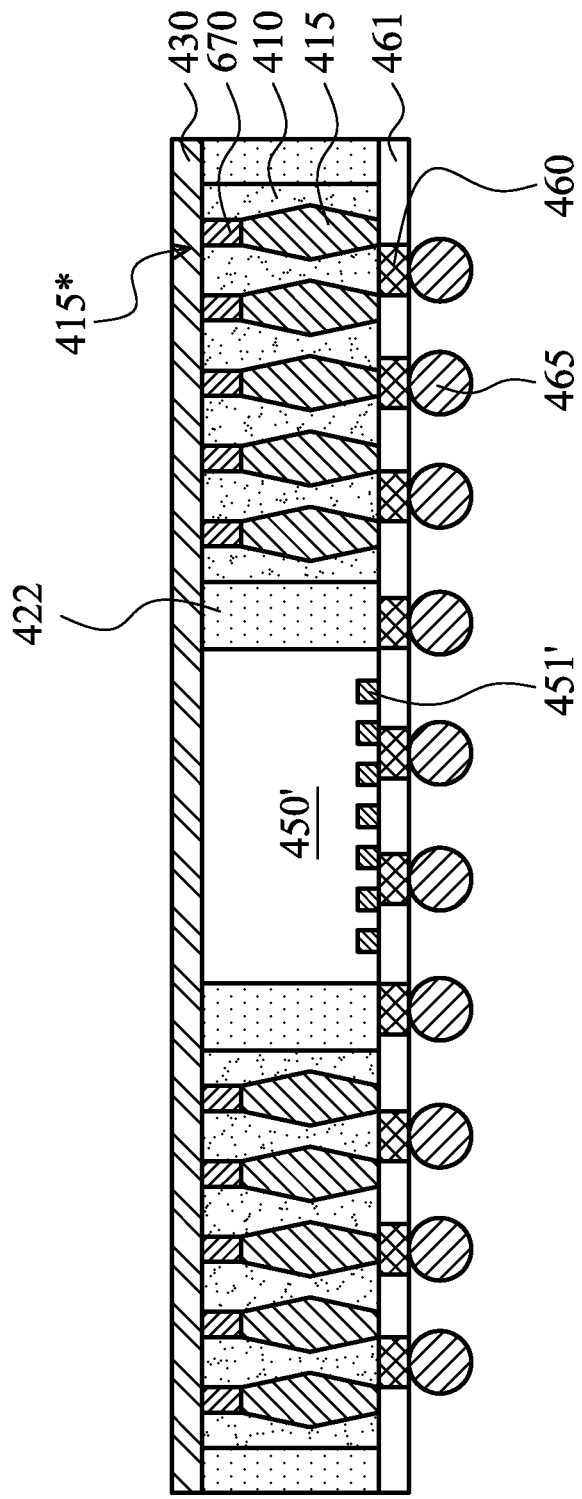
FIG. 6 shows a cross-sectional view of a packaged die, in accordance with some embodiments.
Figure 7A:
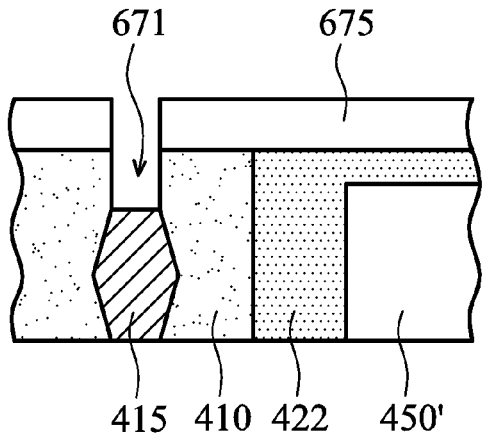
FIGS. 7A-7C show cross-sectional views of a process sequence for forming conductive sections in accordance with some embodiments.
Figure 7B:
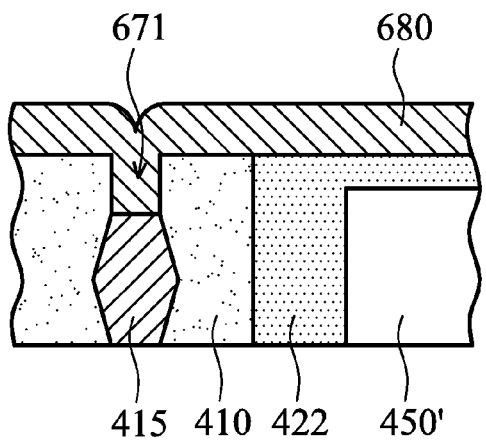
Figure 7C:
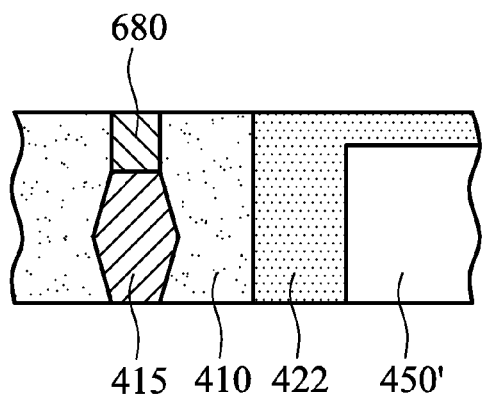

In some embodiments, the semiconductor die 450' in the package is taller than an original height of the TMVs 415, as shown in FIG. 6. As a result, additional conductive sections 670 need to be added to the ends of TMVs 415 to extend its length, as shown in FIG. 6. Additional molding compound 410 may be added to surround the conductive sections 670. TMVs 415 combine with conductive sections 670 to form TMVs 415\*. Various types of conductive materials may be formed to extend the length of the TMVs 415. For example, the conductive sections 670 may be formed of a plated conductive material, such as copper, copper alloy, solder, solder alloy, aluminum, etc. FIGS. 7A-7C show cross-sectional views of a process sequence for forming the conductive sections 670 in accordance with some embodiments. Opening(s) 671 may be formed over the TMVs 415 by using a photoresist layer 675 as an etching mask, as shown in FIG. 7A in accordance with some embodiments. Afterwards, the photoresist layer 675 is removed and a conductive layer 680 may be plated for fill openings 671, as shown in FIG. 7B. The conductive layer 680 may include copper, copper alloy, solder, solder layer, or other applicable materials. Excess conductive material outside openings 671 is then removed, by an etching process or a chemical-mechanical polishing process, for example, as shown in FIG. 7C in accordance with some embodiments.

Figure 8:
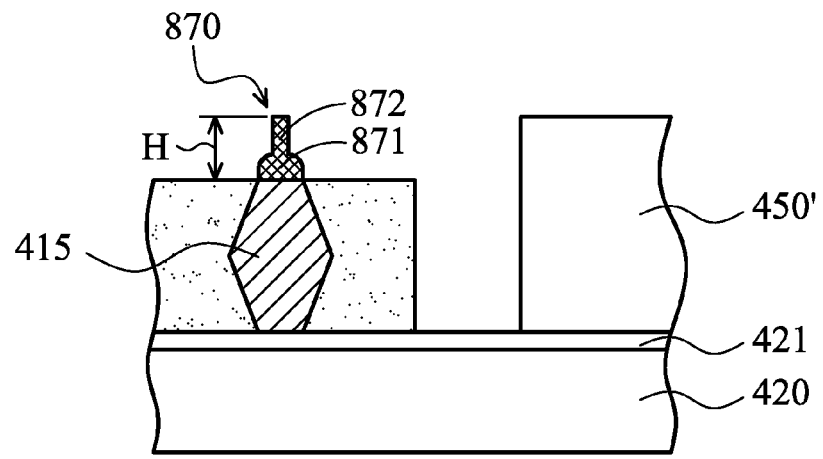
FIG. 8 shows a cross-sectional view of a stud bump with a wire formed over a through-molding via of an interposer frame, in accordance with some embodiments.

Alternatively, stud bumps with wires 870 can be formed over the TMVs 415 to be the additional conductive sections, as shown in FIG. 8 in accordance with some embodiments. Each of the stud bumps with wires 870 includes a stud bump section 871 and a wire section 872, which are formed by a stud bonding process. In some embodiments, the stud bonding process is similar to a wire bonding process. The wire sections 872 are cut to a desired total length H to meet the need. The formation of the study bumps and wires 870 may be performed after die 450 is attached to the carrier 420 (or more precisely to the adhesive layer 421), as shown in FIG. 4B. Afterwards, the stud bumps and wires 870 are formed over TMVs 415, the molding compound 422 is then formed, as described in FIG. 4C.

Figure 9A:
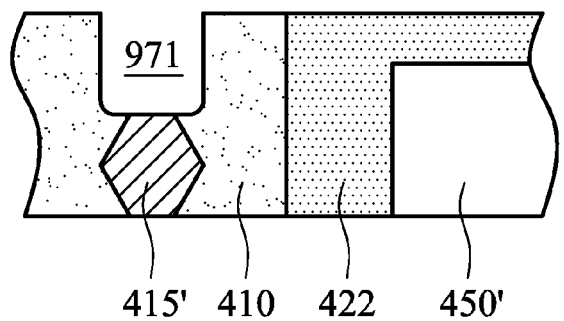
FIGS. 9A and 9B are cross-sectional views of a sequential process used to form conductive sections over through-molding vias of an interposer frame, in accordance with some embodiments.
Figure 9B:
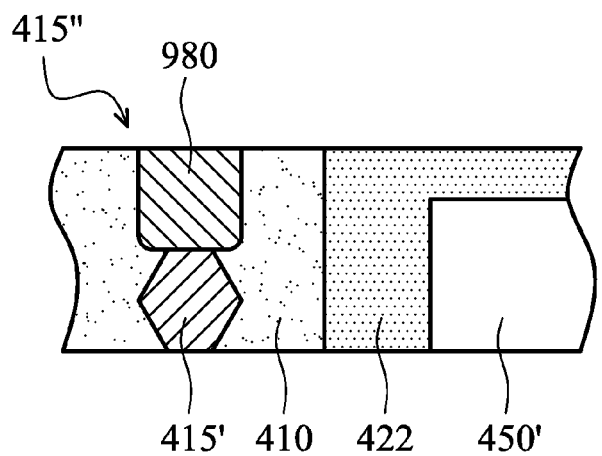

In some embodiments, the TMVs 415' are shorter and wider for low input/output applications. FIGS. 9A and 9B are cross-sectional views of a sequential process used to form conductive sections over through-molding vias of an interposer frame, in accordance with some embodiments. Openings 971 may be formed over TMVs 415' in molding compound 422, as shown in FIG. 9A. A photoresist layer (not shown) may be used as a mask to facilitate the etching process. After opening 971 are formed, a solder ball 980 could be placed in opening 971 and then reflowed to fill opening 971, as shown in FIG. 9B, in accordance with some embodiments. The TMV 415' and solder ball 980 form a TMV 415".

Figure 10A:
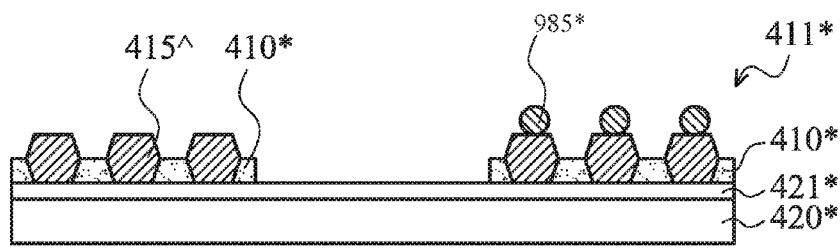
FIGS. 10A-10D are cross-sectional views of a sequential process used to form conductive sections over through-molding vias of an interposer frame, in accordance with some embodiments.

FIGS. 10A-10D are cross-sectional views of a sequential process used to form conductive sections over through-molding vias of an interposer frame, in accordance with some embodiments. FIG. 10A shows an interposer frame 411\* being attached to a carrier 420\*. Interposer frame 411\* includes an opening 412\*. Opening 412\* is not labeled in other drawings for clarity. Carrier 420\* includes an adhesive layer 421\* to secure the interposer frame 411\*. Carrier 420\* could support many interposer frames 411\*, which includes a molding compound 410\* in accordance with some embodiments. The interposer frame 411\* includes through-molding vias (TMVs) 415^, which are isolated from each other by the molding compound 410\*.

Figure 10B:
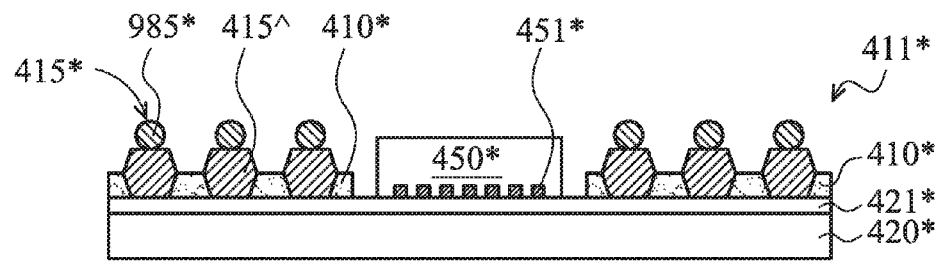

FIG. 10B shows a semiconductor die 450\* being attached to the adhesive layer 421\* and solder balls 985\* being bonded to TMVs 415^ to form TMVs 415*. Semiconductor die 450* includes a device 455*. Device 455* is omitted in other drawings for clarity. The semiconductor die 450* can be attached to the adhesive layer 421* before or after the solder balls 985* being bonded to TMVs 415^.

Figure 10C:
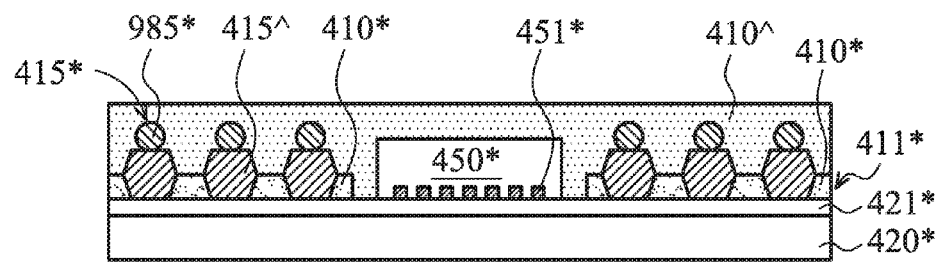

After the semiconductor die 450* is placed and set on the adhesive layer 421*, a molding compound 410^ is formed to fill the space between the semiconductor die 450* and the interposer frame 411*, and also cover the semiconductor die 450* and the interposer frame 411*, as shown in FIG. 10C in accordance with some embodiments. The formation of the molding compound 410^ may include dispensing a molding compound material over semiconductor die 450* and the interposer frame 411* and also curing the molding compound material.

Figure 10D:
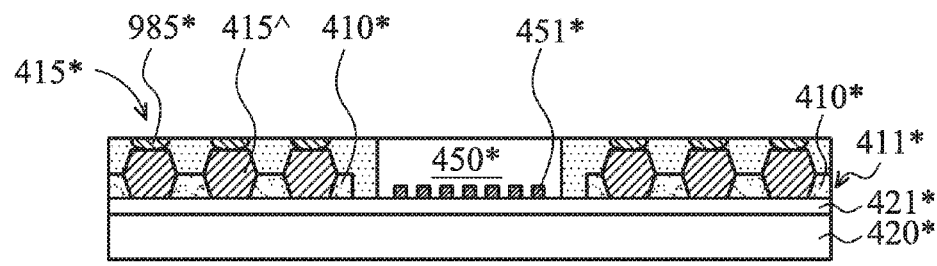

Afterwards, a portion of the molding compound 410^ and a portion of solder balls 985* on the TMVs 415* are removed to expose the TMVs 415*, as shown in FIG. 10D in accordance with some embodiments. The removal process may be a grinding process, a polishing process, or a combination thereof. Afterwards, the interposer frame 411* with the embedded semiconductor die 450* can then undergo other processing sequence similar to the operations described in FIGS. 4E-4I to complete the packaging process.

The embodiments described above in FIGS. 7A-10D are merely examples. Other embodiments of forming the conductive sections 670 of FIG. 6 may also be used. The through-molding vias 415, 415', 415, 415^, and 415* described above include a width in a range from about 10 μm to about 600 μm, in accordance with some embodiments. The through-molding vias 415, 415', 415", 415^, and 415* described above include a height in a range from about 10 μm to about 600 μm, in accordance with some embodiments.

Figure 11A:
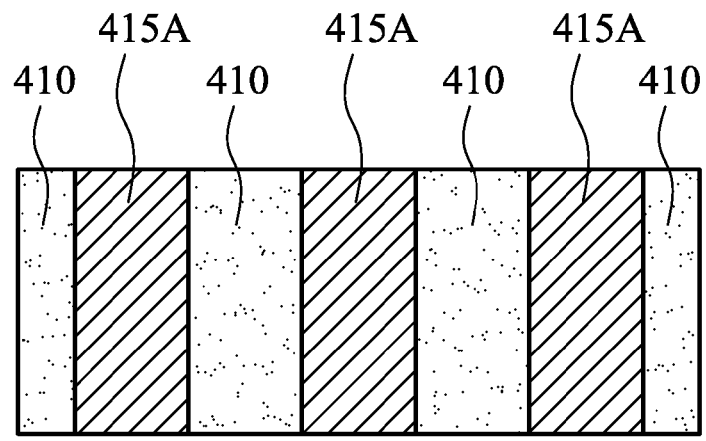
FIGS. 11A and 11B are cross-sectional views of through-molding vias, in accordance with some embodiments.
Figure 11B:
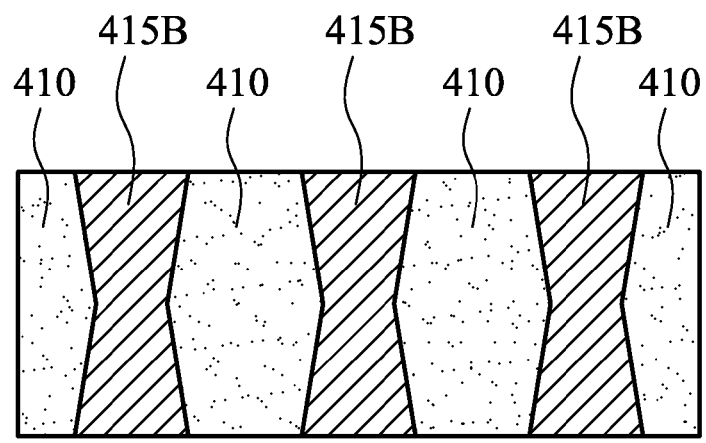

The embodiments of TMVs 415 and 415', 415", 415^, and 415* described above are merely examples. TMVs 415 and 415', 415", 415^, and 415* are wide in a middle (i.e. middle section wider than end sections thereof). However, in some embodiments, other TMV shapes are also possible. For example, the TMVs 415 and 415', 415", 415^, and 415* could have substantially straight sidewalls, as shown in TMVs $415_A$ FIG. 11A, in accordance with some embodiments. Alternatively, the TMVs 415 and 415', 415", 415^, and 415* could be narrow in the middle and wider at end sections thereof, as shown in TMVs $415_B$ of FIG. 11B, in accordance with some embodiments.

The mechanisms of using an interposer frame to package a semiconductor die enables fan-out structures and reduces form factor for the packaged semiconductor die. The mechanisms involve using a molding compound to attach the semiconductor die to the interposer frame and forming a redistribution layer on one or both sides of the semiconductor die. The redistribution layer(s) in the package enables fan-out connections and formation of external connection structures. Conductive columns in the interposer frame assist in thermal management.

In some embodiments, a packaged semiconductor die is provided. The packaged semiconductor die includes an interposer frame, and the interposer frame includes a plurality of conductive columns. The packaged semiconductor die also includes a semiconductor die disposed in an opening within the interposer frame, and a molding compound between the interposer frame and the semiconductor die. The packaged semiconductor die further includes a wiring layer, and the wiring layer connects with devices in the semiconductor die and the plurality of conductive columns of the interposer frame.

In some other embodiments, a packaged semiconductor die is provided. The packaged semiconductor die includes an interposer frame, and the interposer frame includes a plurality of conductive columns. The packaged semiconductor die also includes a semiconductor die disposed in an opening within the interposer frame, and a molding compound between the interposer frame and the semiconductor die. The packaged semiconductor die further includes a wiring layer, and the wiring layer connects with devices in the semiconductor die and the plurality of conductive columns of the interposer frame. In addition, the packaged semiconductor die includes another wiring layer on an opposite side of the semiconductor die from the wiring layer, and the other wiring layer connects with the plurality of conductive columns of the interposer frame.

In yet some other embodiments, a method of packaging a semiconductor die is provided. The method includes providing the semiconductor die, and providing an interposer frame, wherein the interposer frame has a plurality of conductive columns. The method also includes disposing the semiconductor die in an opening of the interposer frame, and forming a molding compound to fill space between the semiconductor die and the interposer frame. The method further includes removing a portion of the molding compound to expose the plurality of conductive columns and forming a redistribution layer to connect devices of the semiconductor die with the plurality of conductive columns.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A semiconductor package, comprising:
a substrate including a passivation layer and a first redistribution layer embedded in the passivation layer, wherein a bottom surface of the first redistribution layer is coplanar with a bottom surface of the passivation layer;
an interposer frame directly contacting the substrate, wherein the interposer frame including a first set of a plurality of conductive columns and a second set of the plurality of conductive columns separated from the first set of the plurality of conductive columns by an interval;
a semiconductor die in the interval and directly contacting the substrate;

a second redistribution layer directly contacting a top surface of the semiconductor die and a top surface of the interposer frame; and a bump on the bottom surface of the first redistribution layer.

2. The semiconductor package of claim 1, wherein at least one conductive column of the first set of conductive columns comprises a copper-containing via and a solder element.

3. The semiconductor package of claim 1, further comprising a molding compound between the semiconductor die and the interposer frame.

4. The semiconductor package of claim 1, wherein each conductive column of the first set of conductive columns are isolated from each other by a molding compound.

5. The semiconductor package of claim 1, wherein at least one conductive column of the first set of conductive columns comprises:

a first portion having a curved surface; and a second portion adjoining the first portion, wherein the second portion has a planar surface.

6. The semiconductor package of claim 1, wherein the interposer frame comprises a molding compound, and at least one conductive column of the first set of conductive columns protrudes from the molding compound.

7. A semiconductor package, comprising:

a passivation layer;

a first redistribution layer embedded in the passivation layer, wherein a bottom surface of the first redistribution layer is coplanar with a bottom surface of the passivation layer;

an interposer frame directly contacting the passivation layer, wherein the interposer frame includes a first set of conductive columns and a second set of conductive columns separated from the first set of conductive columns by an interval;

a semiconductor die in the interval; and a second redistribution layer directly contacting a top surface of the semiconductor die and a top surface of the interposer frame.

8. The semiconductor package of claim 7, wherein at least one conductive column of the first set of conductive columns comprises:

a copper-containing via; and at least a portion of a solder ball.

9. The semiconductor package of claim 8, wherein the solder ball comprises a curved surface adjoining a planar surface of the copper-containing via.

10. The semiconductor package of claim 7, further comprising a bump on the bottom surface of the first redistribution layer.

11. The semiconductor package of claim 7, further comprising a first molding compound between the interposer frame and the semiconductor die.

12. The semiconductor package of claim 11, wherein the interposer frame comprises a second molding compound, and the second molding compound is different from the first molding compound.

13. The semiconductor package of claim 12, wherein at least one conductive column of the first set of conductive columns protrudes from the second molding compound.

14. The semiconductor package of claim 7, wherein the interposer frame is spaced from the semiconductor die in a direction parallel to the bottom surface of the passivation layer.

15. A semiconductor package, comprising:

a passivation layer;

a first redistribution layer embedded in the passivation layer, wherein a bottom surface of the first redistribution layer is coplanar with a bottom surface of the passivation layer;

an interposer frame directly contacting the passivation layer, wherein the interposer frame including a first set of conductive columns and a second set of conductive columns separated from the first set of conductive columns with by an interval;

a semiconductor die in the interval;

a second redistribution layer directly contacting a top surface of the semiconductor die and a top surface of the interposer frame; and a bump on the bottom surface of the first redistribution layer.

16. The semiconductor package of claim 15, wherein at least one conductive column of the first set of conductive columns comprises a copper-containing via and a solder element.

17. The semiconductor package of claim 15, wherein at least one conductive column of the first set of conductive columns comprises a copper-containing via, and the copper-containing via comprises a middle section wider than an end section.

18. The semiconductor package of claim 15, further comprising a molding compound between the interposer frame and the semiconductor die.

19. The semiconductor package of claim 15, wherein the interposer frame comprises a first molding compound, and at least one conductive column of the first set of conductive columns protrudes from the first molding compound.

20. The semiconductor package of claim 19, further comprising a second molding compound different from the first molding compound, wherein the second molding compound is between the first molding compound and the semiconductor die, and the second molding compound directly contacts the at least one conductive column.

* * * * *